United States Patent
Chen et al.

(10) Patent No.: US 7,919,768 B2
(45) Date of Patent: Apr. 5, 2011

(54) PHASE-CHANGE MEMORY ELEMENT

(75) Inventors: Frederick T Chen, Hsinchu (TW); Ming-Jinn Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 384 days.

(21) Appl. No.: 12/172,162

(22) Filed: Jul. 11, 2008

(65) Prior Publication Data
US 2010/0006814 A1  Jan. 14, 2010

(51) Int. Cl.
*H01L 47/00* (2006.01)
(52) U.S. Cl. ... 257/4; 257/2; 257/3; 257/5; 257/E45.002
(58) Field of Classification Search ............... 257/2, 3, 257/4, 5, E45.002
See application file for complete search history.

(56) References Cited

U.S. PATENT DOCUMENTS

| 6,815,266 | B2 | 11/2004 | Rodgers et al. | |
| 6,864,503 | B2 | 3/2005 | Lung | |
| 7,504,652 | B2 * | 3/2009 | Huang | 257/2 |
| 2006/0108667 | A1 | 5/2006 | Lung | |
| 2007/0012905 | A1 | 1/2007 | Huang | |

* cited by examiner

*Primary Examiner* — Evan Pert
*Assistant Examiner* — Selim Ahmed

(57) ABSTRACT

A phase-change memory cell is proposed. The phase-change memory includes a bottom electrode; a phase-change spacer formed to contact the bottom electrode; an electrical conductive layer having a vertical portion and a horizontal portion, wherein the electrical conductive layer electrically connects to the phase-change spacer via the horizontal portion; and a top electrode electrically connected to the electrical conductive layer via the vertical portion of the electrically conductive layer.

10 Claims, 8 Drawing Sheets

PHASE-CHANGE MEMORY ELEMENT

BACKGROUND OF THE INVENTION

1. Field of the Invention

The invention relates to a memory element, and more particularly to a phase-change memory element and method for fabricating the same.

2. Description of the Related Art

Phase-change memory technology requires high reliability, fast speeds, low current, and low operating voltage, in order to function as a viable alternative to current memory technologies such as flash and DRAM. A phase-change memory cell must therefore provide low programming current, low operating voltage, a smaller cell size, a fast phase transformation speed, and a low cost. These requirements are difficult to meet given the current state of the art.

Current phase-change memory technology makes use of heating at the interface between a metal electrode contact and the phase-change material. More effective heating requires a smaller contact area, or equivalently a smaller heating area. A benefit of this strategy is simultaneous reduction of cell size. However, reducing the area results in higher cell resistance, which increases the required driving voltage. All other considerations being the same, the amount of Joule heating is conserved, meaning the operating voltage is inversely proportional to the programming current. This is clearly not desirable. Reducing heating area does not necessarily improve other performance features. Phase transformation speed requires good thermal uniformity within the active region of the cell. The rate of phase-change is extremely sensitive to temperature. Non-uniform heating results in a loss of reliability due to accumulation of incomplete phase-change in the programming volume.

A previously proposed approach uses the intersection between a lower metal electrode contact (width defined by a metal spacer deposition) and a phase-change material spacer (width defined by a phase-change material spacer deposition) to define a small area. However, the thin width of the phase-change spacer raises the operating voltage due to high resistance. It is not feasible to shorten the spacer sidewall height, since that would adversely affect the conformality. On the other hand, the upper metal contact can be thickened so that the contact point can be lowered, but such an enhanced heat sink lowers heating efficiency.

Therefore, it is desirable to devise a phase-change memory cell structure that addresses the aforementioned problems.

BRIEF SUMMARY OF THE INVENTION

An exemplary embodiment a phase-change memory element comprises: a bottom electrode; a phase-change spacer formed to contact the bottom electrode; an electrical conductive layer having a vertical portion and a horizontal portion, wherein the electrical conductive layer electrically connects to the phase-change layer via the horizontal portion; and a top electrode electrically connected to the electrical conductive layer via the vertical portion of the electrical conductive layer.

According to an embodiment of the invention, a method for fabricating a phase-change memory element is provided, comprising the following steps: providing a bottom electrode; forming a first dielectric layer on the bottom electrode, exposing a part of top surface of the bottom electrode; forming an electrically conductive layer, having a vertical portion and a horizontal portion on the first dielectric layer, wherein the horizontal portion of the electrically conductive layer is separated from the bottom electrode by the first dielectric layer; forming a phase-change spacer to contact the bottom electrode, wherein the side-walls of the phase-change spacer directly contacts the horizontal portion of the electrically conductive layer; and forming a top electrode to contact the top surface of the vertical portion of the electrically conductive layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
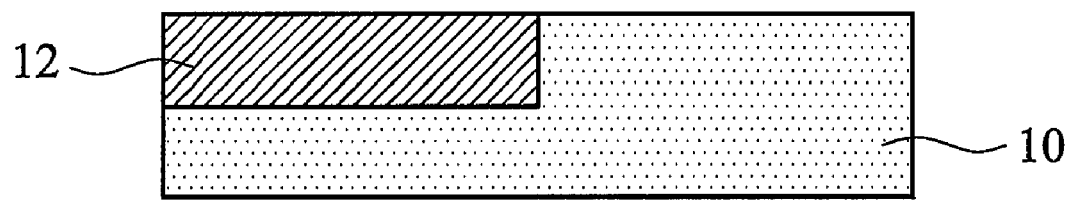
FIGS. 1a-1n are cross sections of a method for fabricating a phase-change memory element according to an embodiment of the invention.

First, referring to FIG. 1a, a substrate 10 with a bottom electrode 12 is provided. Particularly, the substrate 10 can be a substrate employed in a semiconductor process, such as silicon substrate. The substrate 10 can comprise a complementary metal oxide semiconductor (CMOS) circuit, isolation structure, diode, or capacitor (not shown). Suitable material for the bottom electrode 12, for example, is a transition metal, aluminum, silicon, aluminum nitride, a transition metal nitride, or combinations thereof. The bottom electrode 12 may be electrically connected to lower layers of the substrate (not shown).

Figure 1B:
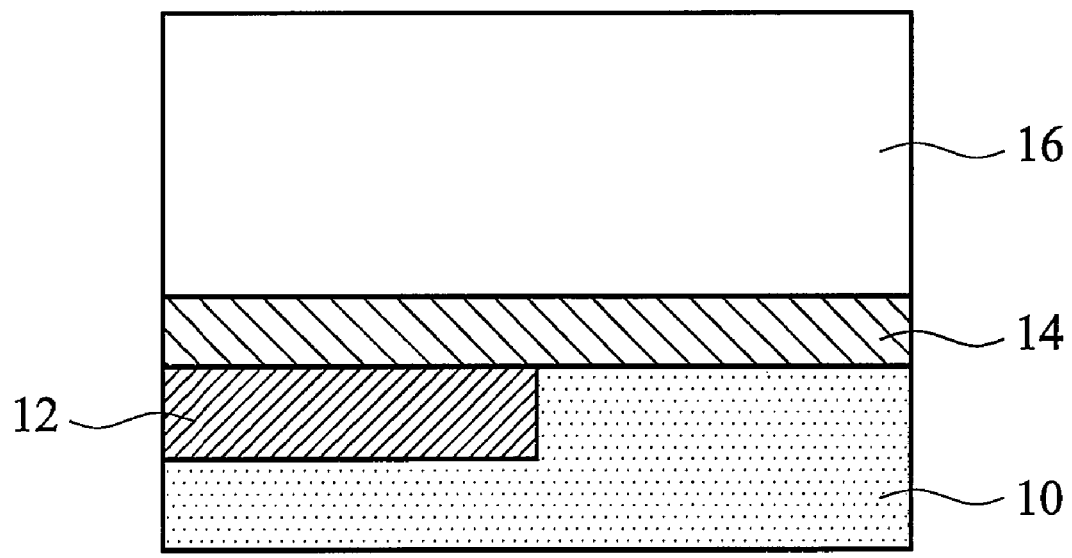

Next, referring to FIG. 1b, dielectric layers 14 and 16 are formed on the bottom electrode 12 and the substrate 10 to cover the bottom electrode 12. The dielectric layer 14 can comprise silicon nitride, and the dielectric layer 16 can comprise silicon oxide, in order that the process for etching the dielectric layer 16 does not inadvertently etch the substrate 10 or electrode 12.

Figure 1C:
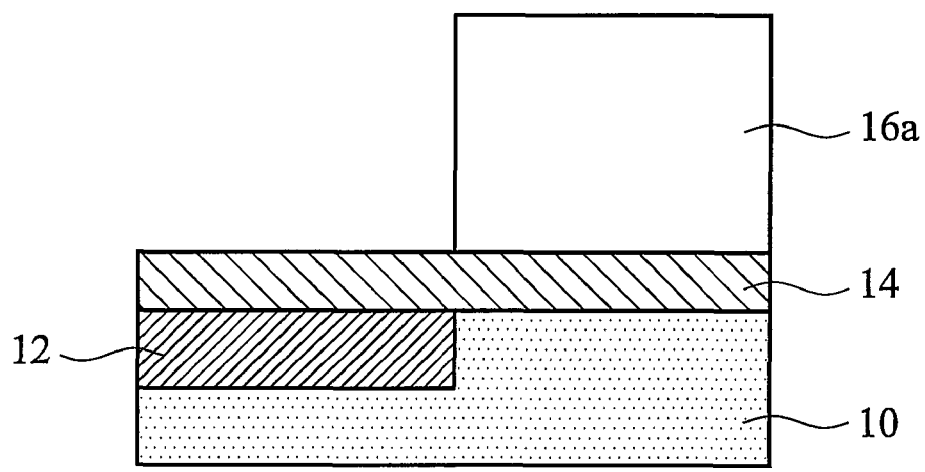

Next, referring to FIG. 1c, the dielectric layer 16 is patterned to form a patterned dielectric layer 16a, exposing the top surface of the dielectric layer 14 directly over the bottom electrode 12.

Figure 1D:
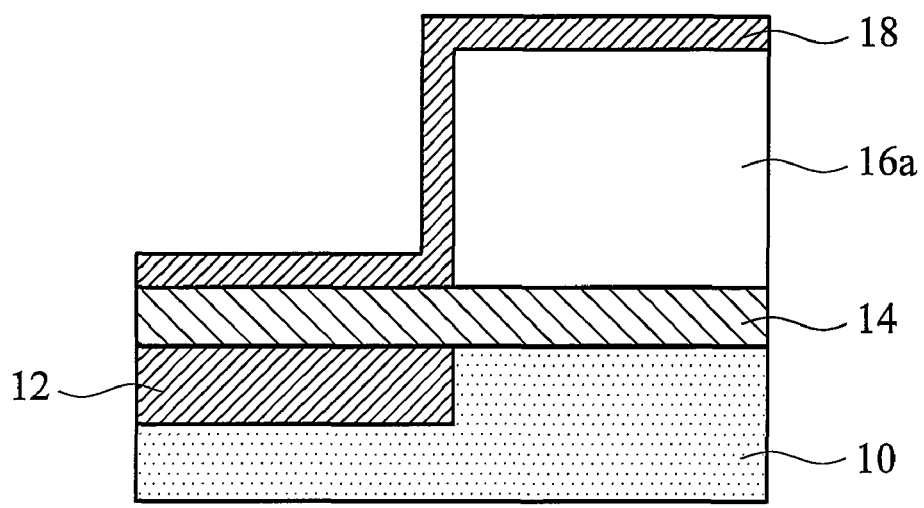

Next, referring to FIG. 1d, an electrically conductive layer 18 is conformally formed on the patterned dielectric layer 16a and the dielectric layer 14. Suitable material of the electrically conductive layer 18, for example, can be a transition metal, aluminum, silicon, aluminum nitride, a transition metal nitride, or combinations thereof. The thickness of the electrically conductive layer 18 is expected to be 1~100 nm.

Figure 1E:
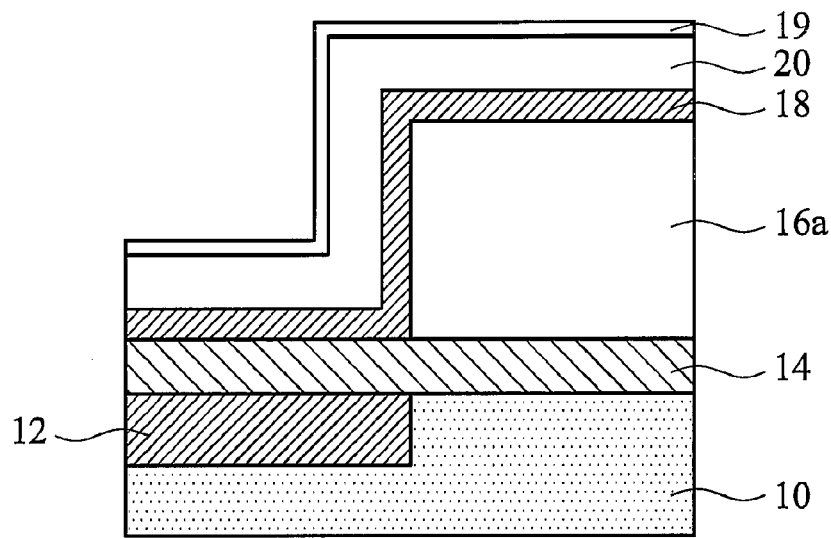

Next, referring to FIG. 1e, a dielectric layer 20 is conformally formed on the electrically conductive layer 18. The dielectric layer 20 can comprise silicon dioxide. A thin dielectric overcoating layer 19 (for example, nitride or the same material as dielectric layers 14) is preferably deposited over the dielectric layer 20, thereby preventing the dielectric layer 20 from being chamfered by subsequently etching shown in FIG. 1f.

Figure 1F:
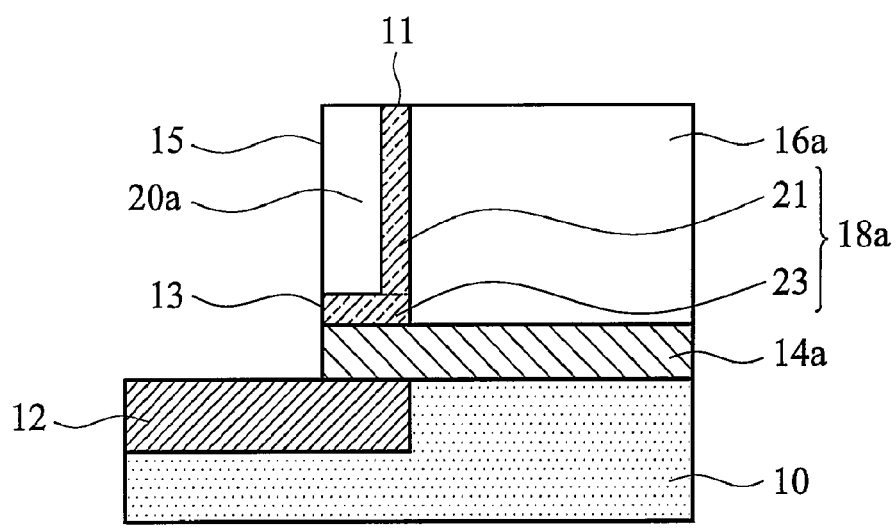

Next, referring to FIG. 1f, the dielectric layer 14, the electrical conductive layer 18, the dielectric layer 20 and the dielectric overcoating layer 19 are etched to expose a part of the top surface of the bottom electrode 12. The overcoating layer may be completely removed in the process, but the dielectric layer underneath is consequently able to maintain a vertical sidewall profile. Further, after etching, an L-shaped electrically conductive layer 18a with a vertical portion 21 and a horizontal portion 23 (referring to FIG. 1f), a patterned dielectric layer 14a, and a patterned dielectric layer 20a remain. It should be noted that the bottom electrode 12 is completely separated from the horizontal portion 23 of the L-shaped electrically conductive layer 18a by the patterned dielectric layer 14a. Further, the top surface 11 of the vertical portion 21 and the side-wall 13 of the horizontal portion 23 are respectively exposed after patterning. In some embodiments, the electrically conductive layer 18 can be patterned by etching without dielectric layers 19 and 20 to form the electrical conductive layer 18a with an 'I' shape or ladder shape.

Figure 1G:
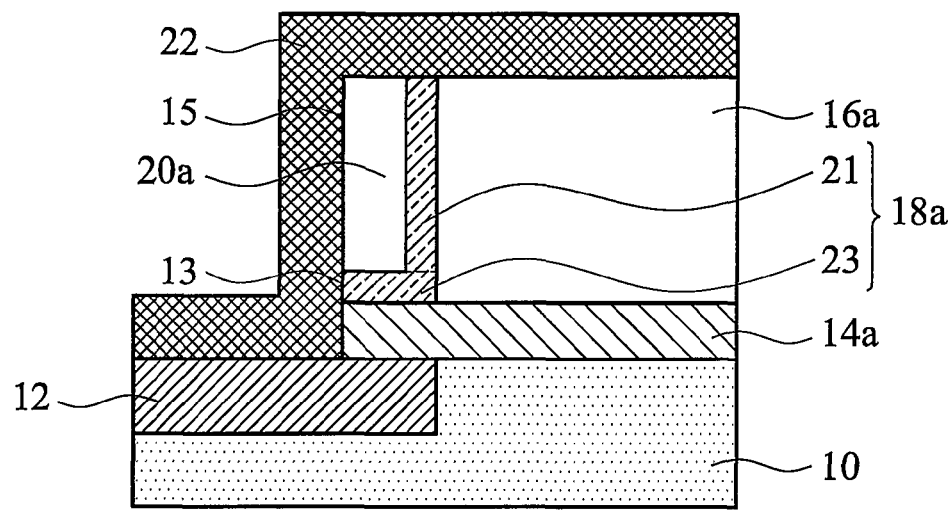

Next, referring to FIG. 1g, a phase-change material layer 22 is conformally formed on the above substrate. The phase-change material layer 22 can comprise In, Ge, Sb, Te, Sn, Ga or combinations thereof, such as GeSbTe or InGeSbTe. It should be noted that the side-wall 15 of the phase-change material layer 22 directly contacts the side-wall 13 of the horizontal portion 23 of the L-shaped electrically conductive layer 18a.

Figure 1H:
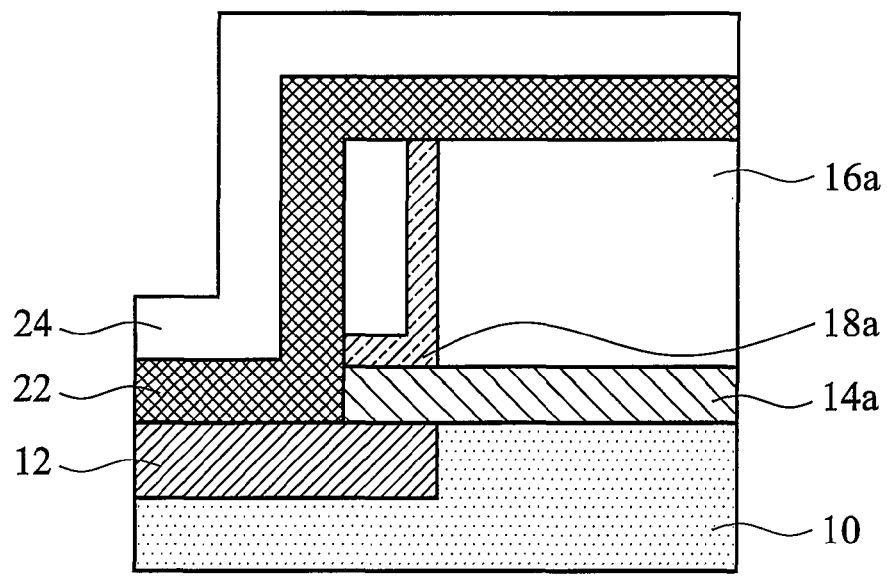

Next, referring to FIG. 1h, a dielectric layer 24 is conformally formed on the phase-change material layer 22. The dielectric layer 24 can comprise silicon dioxide.

Figure 1I:
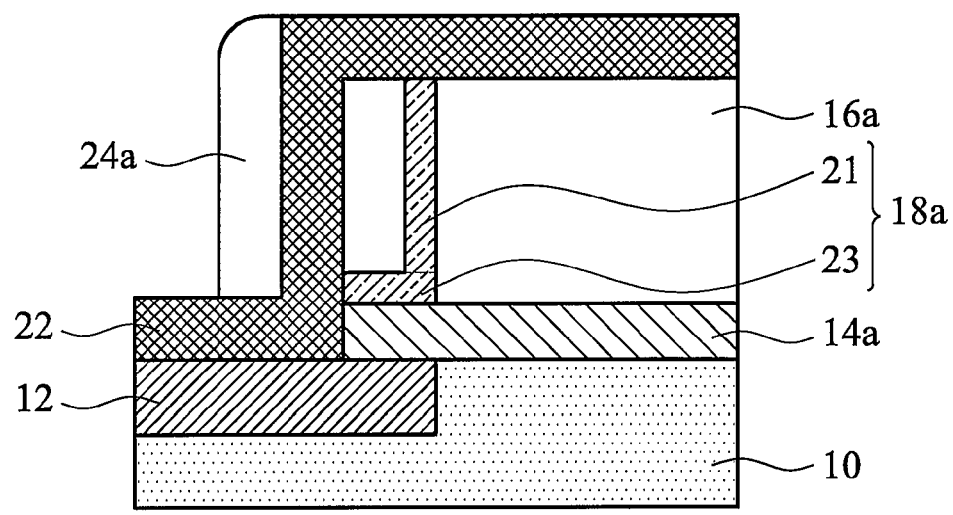

Next, referring to FIG. 1i, the dielectric layer 24 is patterned by etching to form a dielectric spacer 24a, exposing a part of the top surface of the phase-change material layer 22.

Figure 1J:
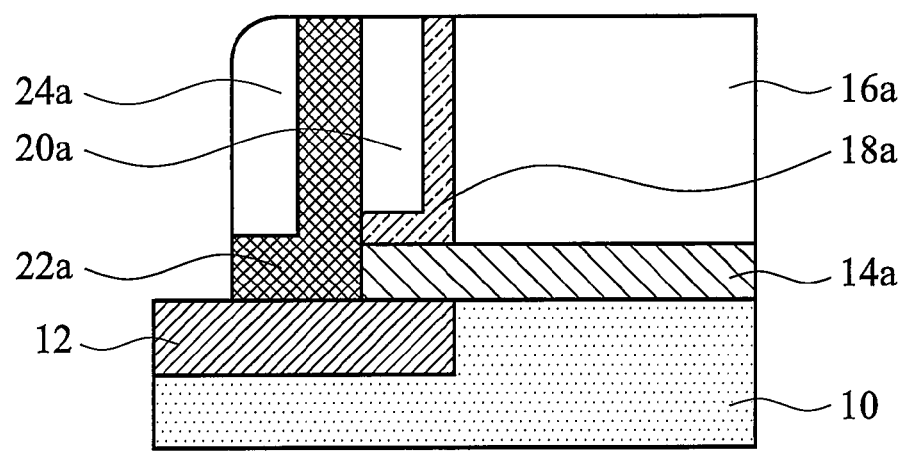

Next, referring to FIG. 1j, the phase-change material layer 22 is etched to form a phase-change spacer 22a with the dielectric spacer 24a acting as a mask. Herein, the phase-change spacer 22a can be L-shaped. According to another embodiment of the invention, after forming the structure as shown in FIG. 1g, the phase-change material layer 22 can be patterned by etching without dielectric layer 24 to form the phase-change spacer 22a with a I-shape.

Figure 1K:
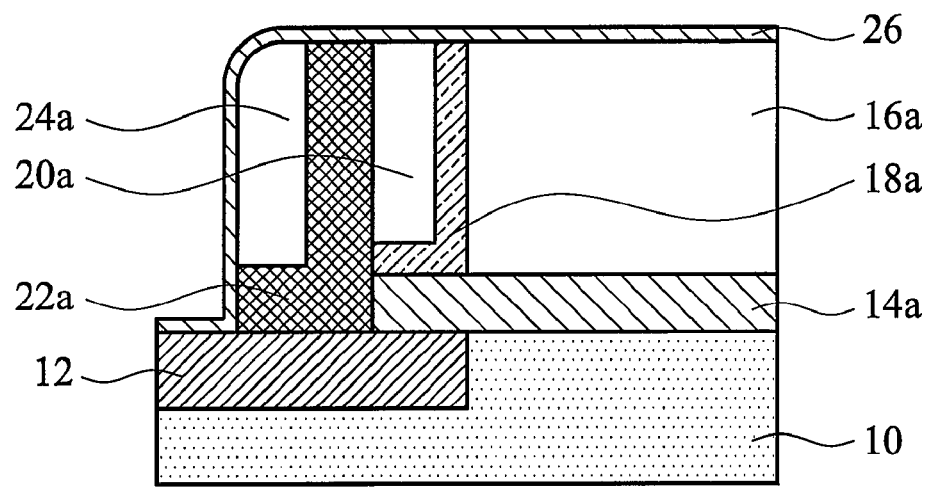

Next, referring to FIG. 1k, a protective layer 26 is conformally formed on the structure of FIG. 1j to completely cover the top surface of the phase-change spacer 22a and the top surface 11 of the vertical portion 21. The protective layer 26 can comprise silicon nitride and has a thickness of 1~10 nm, in order to protect the dielectric layer 16 and top surface 11 of the vertical portion 21 of the conductive layer 18a from being etched inadvertently in subsequent steps.

Figure 1L:
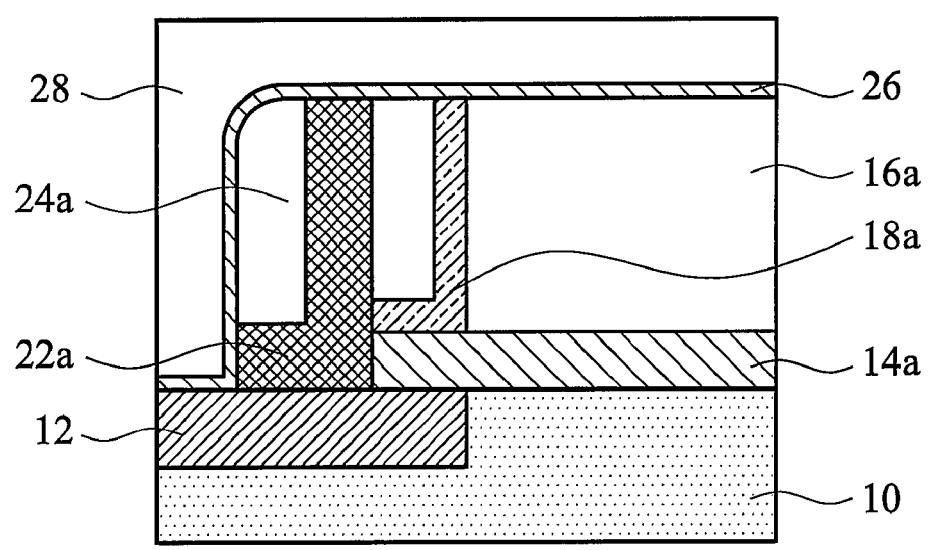

Next, referring to FIG. 1l, a dielectric layer 28 is formed on the protective layer 26. The dielectric layer 28 can comprise silicon dioxide.

Figure 1M:
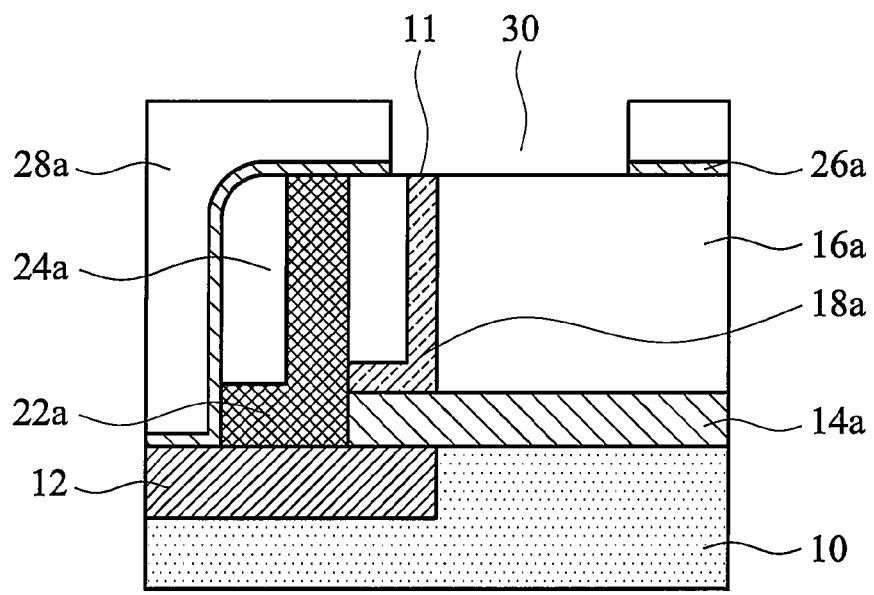

Next, referring to FIG. 1m, the protective layer 26 and the dielectric layer 28 are patterned to form an opening 30 to expose the top surface 11 of the vertical portion 21 of the L-shaped electrically conductive layer 18a.

Figure 1N:
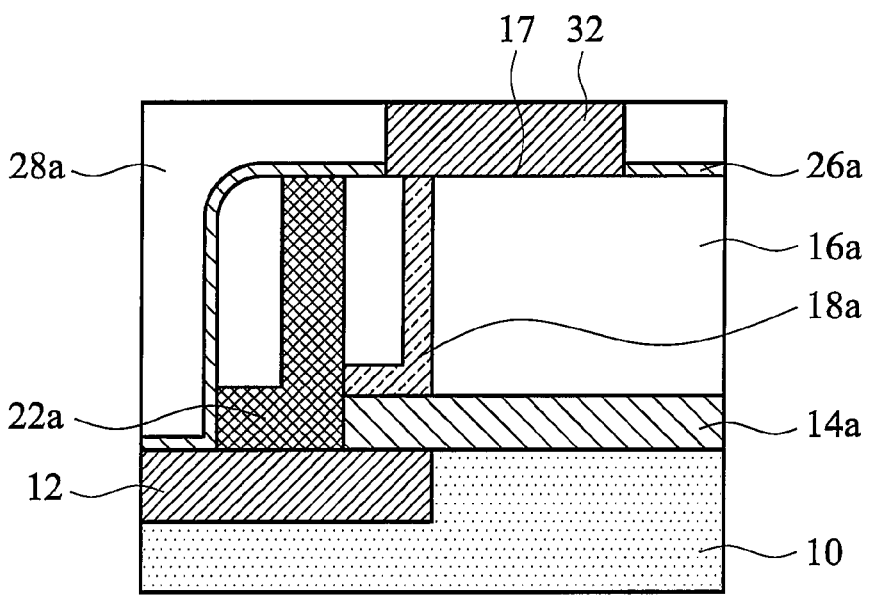

Finally, referring to FIG. 1n, a top electrode 32 is subsequently formed to refill the opening, and the bottom 17 of the top electrode directly contacts to the top surface 11 of the vertical portion 21 of the L-shaped electrically conductive layer 18a. Suitable material for the top electrode 32, for example, is a transition metal, aluminum, silicon, aluminum nitride, a transition metal nitride, or combinations thereof.

Accordingly, the phase-change memory cell is proposed where an L-shaped electrical conductive layer contacts the phase-change spacer. The phase-change spacer runs parallel to the vertical portion of the L-shaped electrically conductive layer. As may be understood by those familiar with the technology, both the conductive and phase-change L-shaped spacers can extend long distances but need to be eventually trimmed at the ends of the dielectric feature 16a. This is most easily accomplished by forming a sloped profile on the dielectric feature 16a at the ends where the spacer layers need to be removed. This can be accomplished by deliberately adjusting off-axis illumination and numerical aperture for patterning of the dielectric feature 16a, so that a partial exposure gradient is achieved in the low image contrast at the ends. Alternatively, a second etch mask formed by photolithography protects the portions of the dielectric feature 16a from a subsequent trimming etch.

Figure 2:
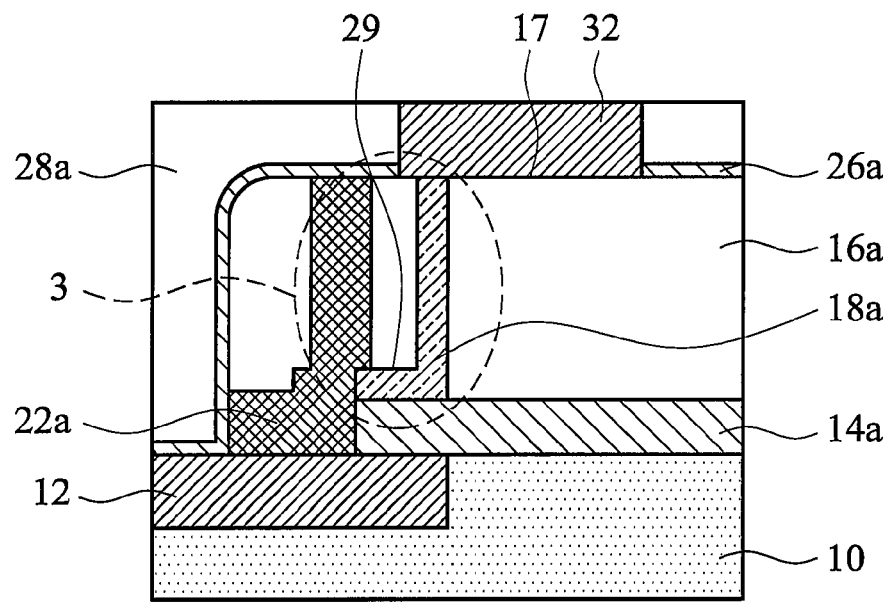
FIG. 2 is a cross section of a phase-change memory element according to another embodiment of the invention.
Figure 3:
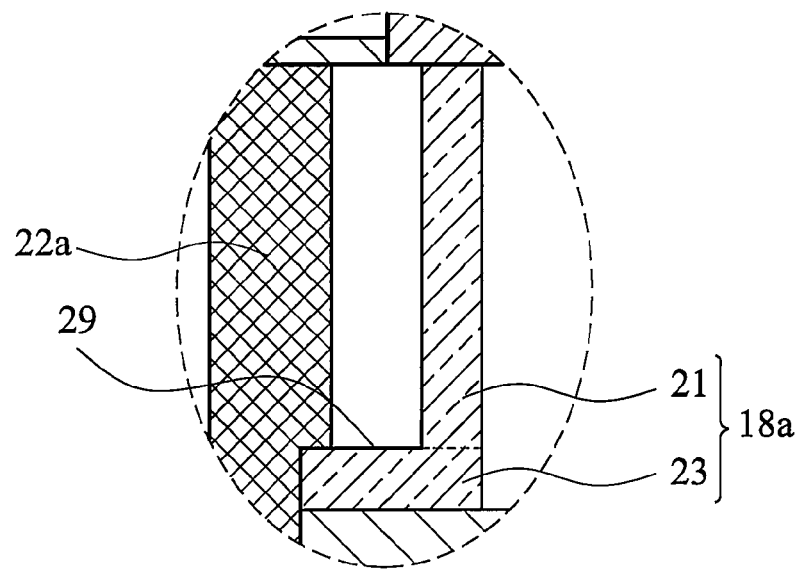
FIG. 3 is a close-up view of location 3 shown in FIG. 2.

In another embodiment of the invention, the phase-change spacer can directly contact with at least one of the top surface and the side-walls of the horizontal portion of the L-shaped electrically conductive layer. Referring to FIG. 2, namely, the contact between the L-shaped electrically conductive layer 18a and the phase-change spacer 22a can either be only the side-walls of the horizontal portion of the L-shaped electrically conductive layer 18a or can also include a part of the top surface 29 of the horizontal portion of the L-shaped electrically conductive layer 18a. FIG. 3 is a close-up view of location 3 shown in FIG. 2. Referring to FIG. 3, the phase-change spacer 22a can be ladder-shaped.

The heating area occurs at the intersection of the phase-change spacer 22a and bottom electrode 12 and is limited by the L-shaped electrically conductive layer 18a.

Rather than having the top metal electrode contact the phase-change spacer directly, an L-shaped electrically conductive layer "bridge" is used. The L-shaped electrically conductive layer thickness is thin, so the loss of heat to the top electrode is reduced. Also, the position of the heating contact can be as low as possible, and the thin metal contact also confines current better, resulting in more efficient heating. The difference between the two embodiments (FIG. 1n and FIG. 2) is that the phase-change element as shown in FIG. 2 makes use of a horizontal and vertical surface contact, in case formation of a vertical surface contact is plagued by contamination or oxidation issues.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-change memory element, comprising:
   a bottom electrode;
   a phase-change spacer formed to contact the bottom electrode;
   an electrically conductive layer having a vertical portion and a horizontal portion, wherein the electrically conductive layer electrically connects to the phase-change spacer via the horizontal portion; and
   a top electrode electrically connected to the electrical conductive layer via the vertical portion of the electrically conductive layer.

2. The phase-change memory element as claimed in claim 1, wherein the bottom electrode is separated from the electrical conductive layer by a dielectric layer.

3. The phase-change memory element as claimed in claim 1, wherein the thickness of the horizontal portion of the electrically conductive layer is 10~100 nm.

4. The phase-change memory element as claimed in claim 1, wherein the top electrode does not contact with the phase-change spacer.

5. The phase-change memory element as claimed in claim 1, wherein the phase-change spacer comprises In, Ge, Sb, Te, Ga, Sn or combinations thereof.

6. The phase-change memory element as claimed in claim 1, wherein the electrically conductive layer comprises a transition metal, aluminum, silicon, aluminum nitride, a transition metal nitride, or combinations thereof.

7. The phase-change memory element as claimed in claim 1, wherein the top and bottom electrodes respectively comprise a transition metal, aluminum, silicon, aluminum nitride, a transition metal nitride, or combinations thereof.

8. The phase-change memory element as claimed in claim 1, wherein the phase-change spacer directly contacts with at least one of the top surface and the side-wall of the horizontal portion of the electrically conductive layer.

9. The phase-change memory element as claimed in claim 1, wherein the phase-change spacer is L-shaped, I-shaped, or ladder-shaped.

10. The phase-change memory element as claimed in claim 1, wherein the electrical conductive layer is L-shaped, I-shaped, or ladder-shaped.

* * * * *